(12) United States Patent
Kim

(10) Patent No.: US 12,219,792 B2
(45) Date of Patent: Feb. 4, 2025

(54) ELECTRONIC APPARATUS HAVING A DISPLAY MODULE AND A CHASSIS

(71) Applicant: Samsung Display Co., Ltd., Yongin-si (KR)

(72) Inventor: Yongil Kim, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 712 days.

(21) Appl. No.: 17/389,205

(22) Filed: Jul. 29, 2021

(65) Prior Publication Data

US 2022/0102673 A1  Mar. 31, 2022

(30) Foreign Application Priority Data

Sep. 28, 2020 (KR) .................. 10-2020-0126055

(51) Int. Cl.
*H10K 50/84* (2023.01)
*H10K 59/12* (2023.01)
*H10K 59/38* (2023.01)

(52) U.S. Cl.
CPC ............. *H10K 50/84* (2023.02); *H10K 59/12* (2023.02); *H10K 59/38* (2023.02)

(58) Field of Classification Search
CPC ......... H10K 50/84; H10K 59/38; H10K 59/12
USPC .......................................................... 257/40
See application file for complete search history.

(56) References Cited

U.S. PATENT DOCUMENTS

| | | | |
|---|---|---|---|
| 6,965,816 B2 | 11/2005 | Walker | |
| 9,971,076 B2 | 5/2018 | Park et al. | |
| 10,191,314 B2 | 1/2019 | Jeong | |
| 10,437,089 B2 | 10/2019 | Jung et al. | |
| 10,517,173 B2 | 12/2019 | Kim | |
| 2015/0237182 A1 | 8/2015 | Lee et al. | |
| 2019/0069425 A1 | 2/2019 | Ryu et al. | |
| 2019/0204658 A1 | 7/2019 | Wang et al. | |
| 2020/0027391 A1* | 1/2020 | Cho | H10K 59/12 |

FOREIGN PATENT DOCUMENTS

| | | |
|---|---|---|
| EP | 3333622 | 6/2018 |
| KR | 1020160000569 A | 1/2016 |
| KR | 1020160110748 A | 9/2016 |
| KR | 1020170061765 A | 6/2017 |
| KR | 10-2018-0062269 | 6/2018 |
| KR | 1020180115658 A | 10/2018 |
| KR | 1020180118842 A | 11/2018 |
| KR | 1020190123193 A | 10/2019 |
| KR | 10-2020-0010822 | 1/2020 |
| KR | 10-2020-0028554 | 3/2020 |
| KR | 10-2020-0036491 | 4/2020 |

* cited by examiner

*Primary Examiner* — Xia L Cross
(74) *Attorney, Agent, or Firm* — CANTOR COLBURN LLP

(57) ABSTRACT

An electronic apparatus includes a display module including a front surface and a rear surface and displaying an image via the front surface and a chassis accommodating the display module. The chassis includes a bottom portion provided with an opening defined therethrough and including an inner surface adjacent to the display module and an outer surface facing the inner surface, a bezel portion protruding from the inner surface of the bottom portion, and a chassis plate disposed in the opening.

20 Claims, 16 Drawing Sheets

FIG. 11
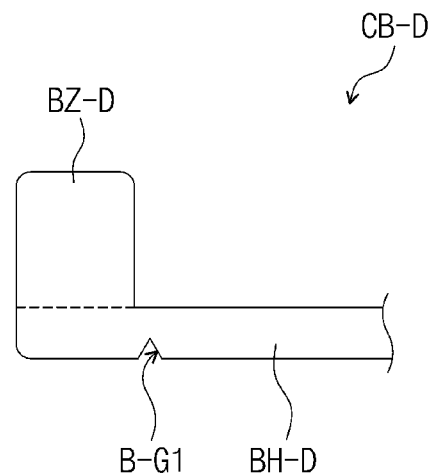
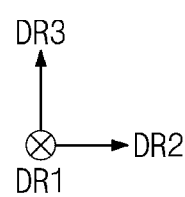
FIG. 12
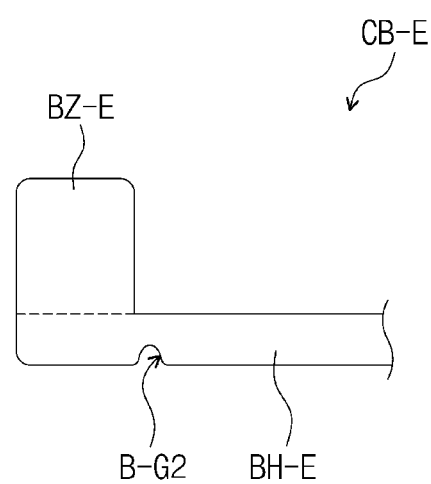
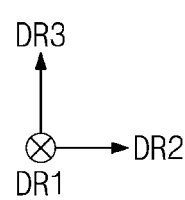

ELECTRONIC APPARATUS HAVING A DISPLAY MODULE AND A CHASSIS

CROSS-REFERENCE TO RELATED APPLICATION

This application claims priority from and the benefit of Korean Patent Application No. 10-2020-0126055, filed on Sep. 28, 2020, which is hereby incorporated by reference for all purposes as if fully set forth herein.

BACKGROUND

Field

Embodiments of the invention relate generally to an electronic apparatus. More particularly, the present disclosure relates to an electronic apparatus having improved aesthetics and strength.

Discussion of the Background

An electronic apparatus includes a display module and a bottom chassis. The display module includes a transmissive display part that selectively transmits a source light generated by a light source or an emissive display part that self-emits the source light at its display part. The display part includes different types of color control layers depending on pixels to generate color images. The color control layers transmit only a partial wavelength range of the source light or converts the color of the source light. Some color control layers change a property of a light without changing the color of the source light. The bottom chassis accommodates the display module and provides a bezel part visible to and thereby perceived by a user.

The above information disclosed in this Background section is only for understanding of the background of the inventive concepts, and, therefore, it may contain information that does not constitute prior art.

SUMMARY

The present disclosure provides an electronic apparatus capable of allowing a bottom chassis to be easily manufactured and having improved aesthetics and strength.

Additional features of the inventive concepts will be set forth in the description which follows, and in part will be apparent from the description, or may be learned by practice of the inventive concepts.

One embodiment provides an electronic apparatus including a display module including a front surface and a rear surface and displaying an image via the front surface, and a chassis accommodating the display module. The chassis includes a bottom portion provided with an opening defined therethrough and including an inner surface adjacent to the display module and an outer surface facing the inner surface, a bezel portion protruding from the inner surface of the bottom portion, and a chassis plate disposed in the opening.

The bezel portion may include a side surface of the display module.

The bezel portion may have a predetermined curvature.

An edge of the bezel portion and a edge of the bottom portion adjacent to the bezel portion may have a predetermined curvature.

The curvature of the edge of the bottom portion may be greater than the curvature of the edge of the bezel portion.

The bezel portion may include a first bezel portion substantially parallel to the bottom portion, a second bezel portion inclined from the first bezel portion, and a third bezel portion spaced apart from the second bezel portion with the first bezel portion interposed therebetween and inclined from the first bezel portion.

The bottom portion may include a first bottom portion on which the bezel portion is disposed and a second bottom portion extending from the first bottom portion and provided with the opening defined therein, and the first bottom portion has a thickness greater than a thickness of the second bottom portion.

The bottom portion may be provided with a groove defined by removing a portion of the bottom portion along a thickness direction of the bottom portion.

The groove may have a V shape, a U shape, or a U bracket shape when viewed in a cross-section.

The bottom portion further may include a reinforcing portion adjacent to a side surface of the bottom portion, which defines the opening, and protruding from the outer surface of the bottom portion.

The reinforcing portion may include a first reinforcing portion substantially perpendicular to the bottom portion and a second reinforcing portion extending from the first reinforcing portion and substantially parallel to the bottom portion.

The reinforcing portion may further include a third reinforcing portion protruding from the second reinforcing portion toward the bottom portion.

The reinforcing portion may include a first reinforcing portion inclined with respect to the bottom portion and a second reinforcing portion inclined from the first reinforcing portion to the bottom portion.

The reinforcing portion may have a predetermined curvature.

The bottom portion may include an engaging portion disposed adjacent to the opening and coupled to the chassis plate.

The bezel portion may include an upper portion and a lower portion, which are spaced apart from each other in a first direction and extend in a second direction crossing the first direction, and a first side portion and a second side portion, which are spaced apart from each other in the second direction, extend in the first direction, and connected to the upper portion and the lower portion. The bottom portion may include an upper portion connected to the upper portion of the bezel portion, a first side portion connected to the first side portion of the bezel portion, and a second side portion connected to the second side portion of the bezel portion.

The opening may be defined by the upper portion, the first side portion, and the second side portion of the bottom portion and the lower portion of the bezel portion.

The electronic apparatus may further include an electronic module electrically connected to the display module and including at least one of a power supply unit, a speaker, a memory, an illumination sensor, and a driver, and the electronic module is disposed on the chassis plate.

The display module may include a display unit including a first display substrate including a circuit element layer including a transistor, a display element layer including a light emitting element connected to the transistor, and an upper insulating layer covering the display element layer and a second display substrate spaced apart from the first display substrate with a predetermined gap defined therebetween and including a color control layer including a quantum dot.

The display module may include a circuit element layer including a transistor, a display element layer including a light emitting element connected to the transistor, an upper insulating layer covering the display element layer, and a color control layer making contact with the upper insulating layer, and the color control layer includes a quantum dot.

According to the above, the bottom portion that accommodates the display module therein is integrally formed with the bezel portion that surrounds the display module to define a bezel area, and thus, the electronic apparatus has improved aesthetics.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

FIG. 11 is a cross-sectional view showing a portion of a bottom chassis according to an embodiment.

FIG. 12 is a cross-sectional view showing a portion of a bottom chassis according to an embodiment.

DETAILED DESCRIPTION

Figure 1:
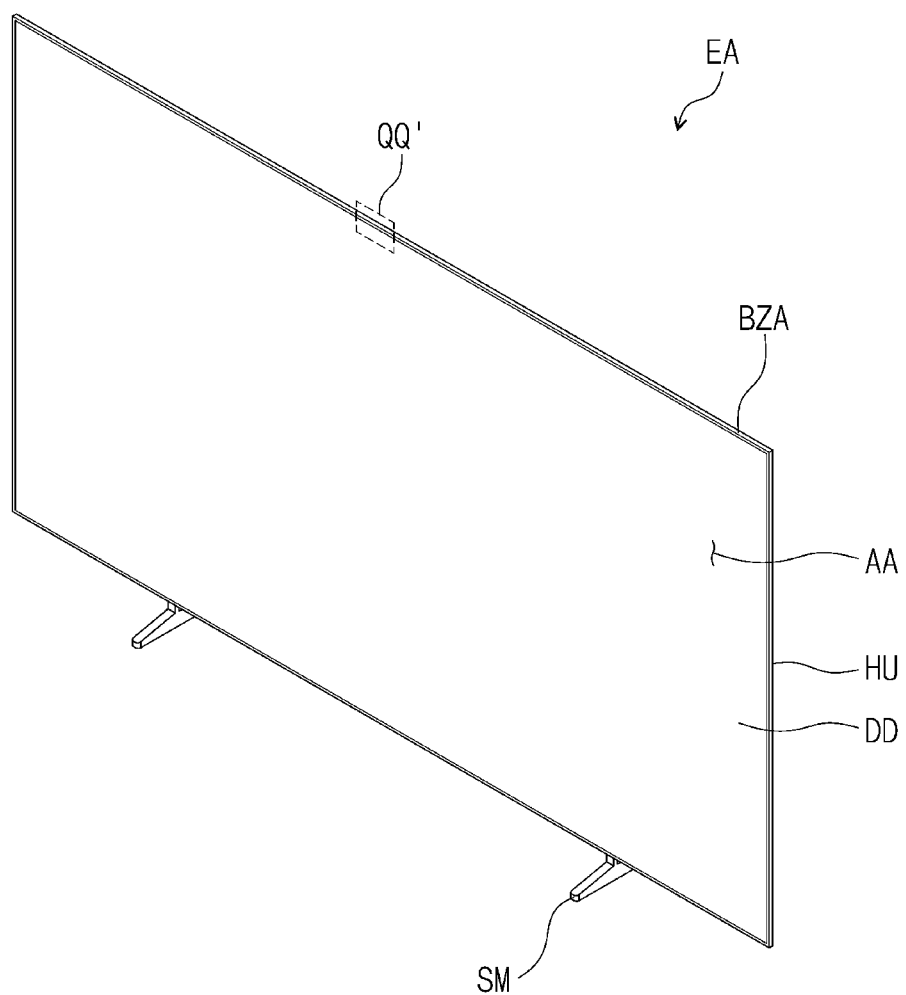
FIG. 1 is an assembled perspective view showing an electronic apparatus according to an embodiment that is constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
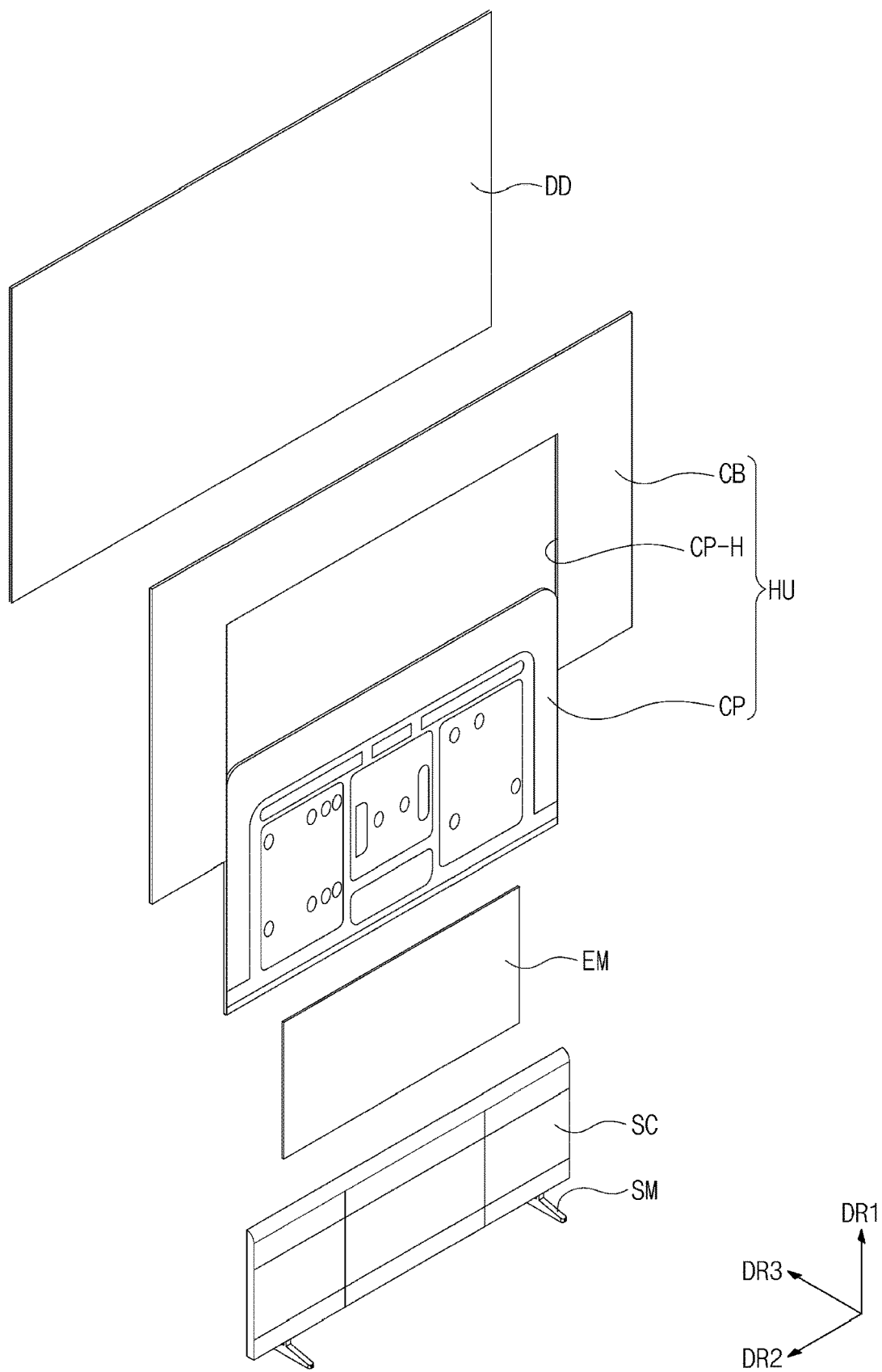
FIG. 2 is an exploded perspective view showing an electronic apparatus according to an embodiment.
Figure 3:
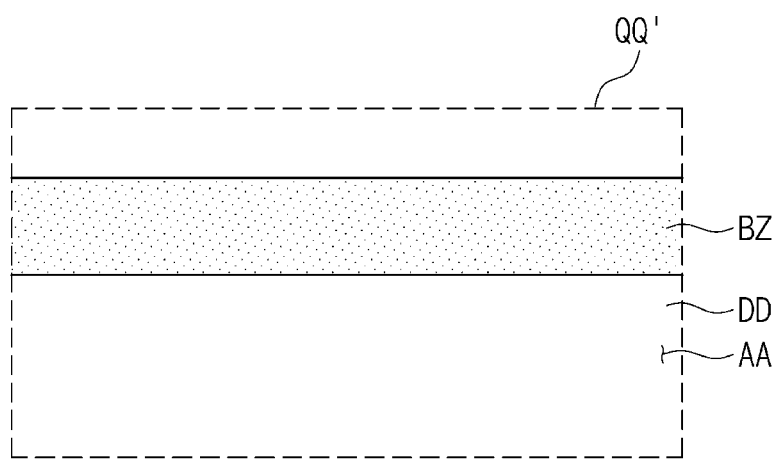
FIG. 3 is an enlarged plan view showing an area QQ' shown in FIG. 1.
Figure 4:
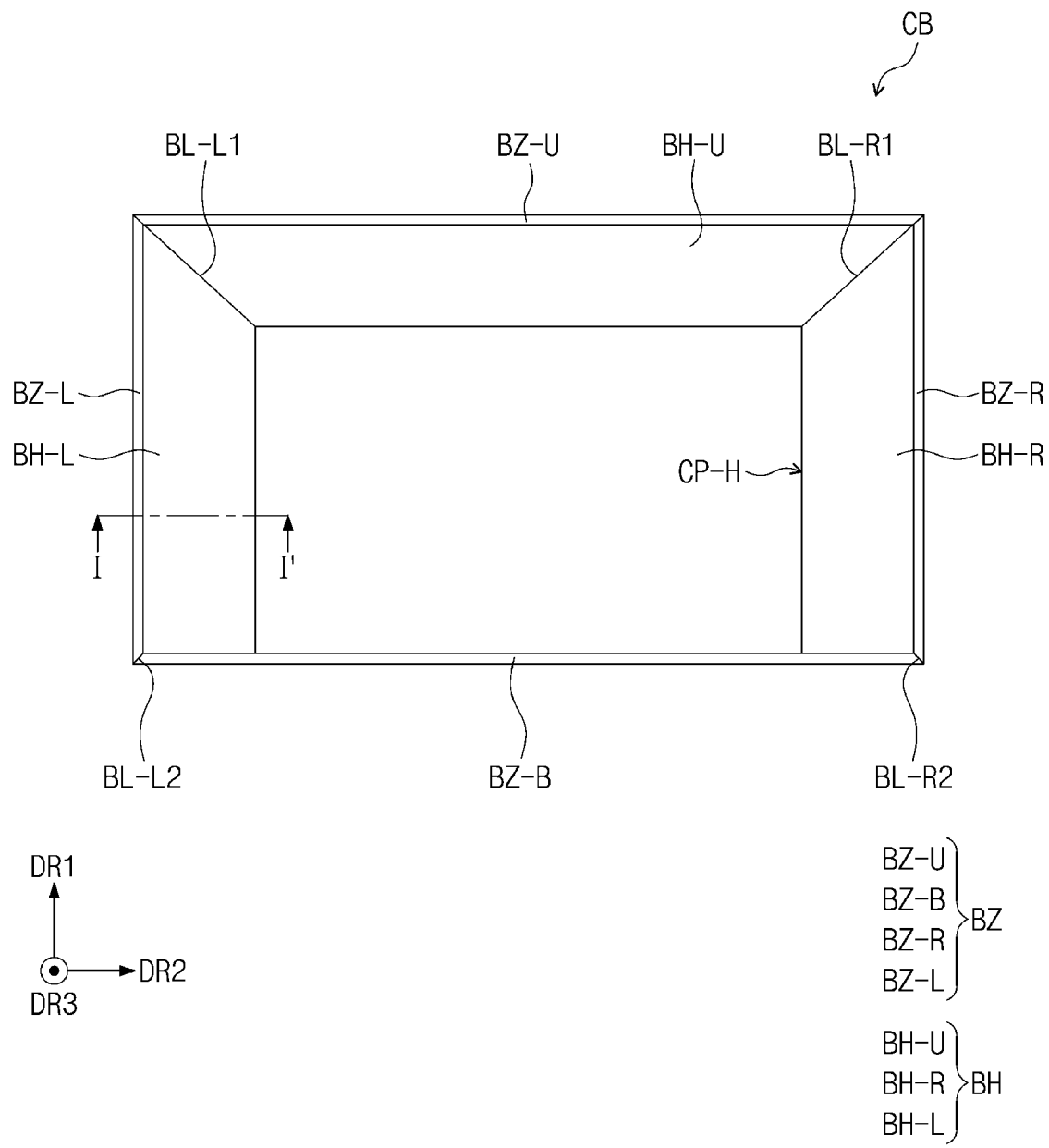
FIG. 4 is a plan view showing a bottom chassis according to an embodiment.
Figure 5:
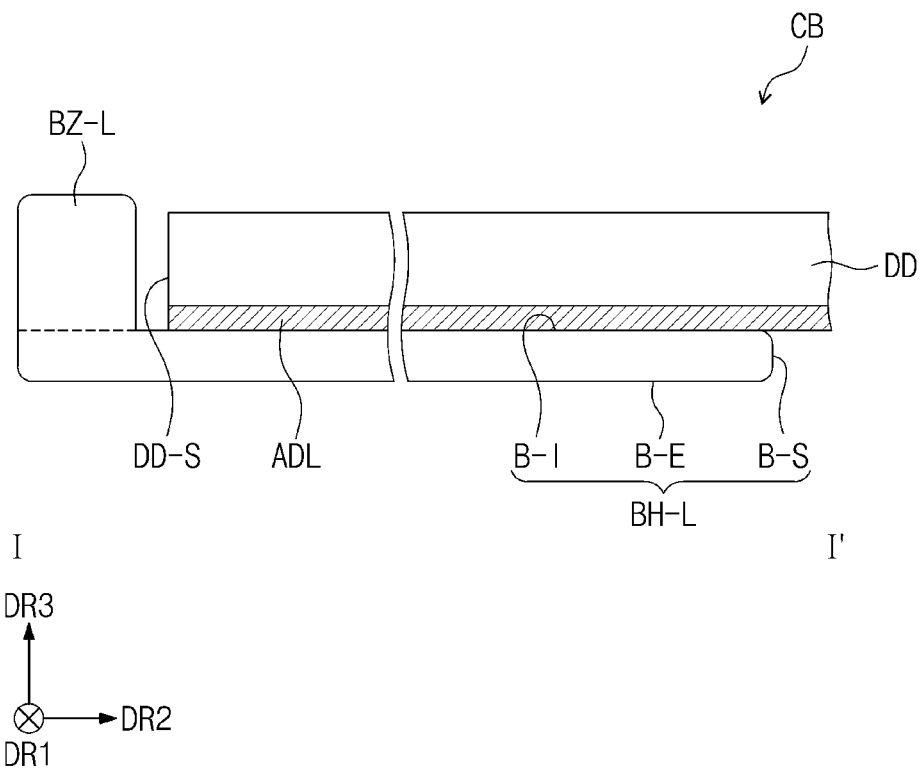
FIG. 5 is a cross-sectional view showing a bottom chassis taken along a line I-I' shown in FIG. 4.

FIG. 1 is an assembled perspective view showing an electronic apparatus EA according to an embodiment that is constructed according to principles of the invention. FIG. 2 is an exploded perspective view showing the electronic apparatus EA according to an embodiment. FIG. 3 is an enlarged plan view showing an area QQ' shown in FIG. 1. FIG. 4 is a plan view showing a bottom chassis according to an embodiment. FIG. 5 is a cross-sectional view showing the bottom chassis taken along a line I-I' shown in FIG. 4.

Referring to FIGS. 1 and 2, the electronic apparatus EA may be an apparatus that is activated in response to an electrical signal. The electronic apparatus EA may include various embodiments. For example, the electronic apparatus EA may be applied to a large-sized electronic item, such as a television set, a monitor, or an outdoor billboard, and a small and medium-sized electronic item, such as a personal computer, a notebook computer, a personal digital assistant, a car navigation unit, a game unit, a mobile electronic device, and a camera.

In addition, these are merely illustrative, and thus, the electronic apparatus EA may be applied to other electronics as long as they do not depart from the concepts of the present disclosure as described herein. In the embodiments described with reference to FIG. 1 and other figures, a television will be described as a representative example of the electronic apparatus EA.

The electronic apparatus EA may display an image to a third direction DR3 through an active area AA substantially parallel to a first direction DR1 and a second direction DR2 that is orthogonal to the first direction DR1.

In the embodiment described herein, front (or upper) and rear (or lower) surfaces of each member of the electronic apparatus EA are defined with respect to a direction in which the image is displayed. The front and rear surfaces face each other in the third direction DR3, and a normal line direction of each of the front and rear surfaces is substantially parallel to the third direction DR3 that is orthogonal to the first direction DR1 and the second direction DR2 (i.e., DR1 corresponds to an x-axis, DR2 corresponds to a y-axis, and DR3 corresponds to a z-axis in an x-y-z three dimensional coordinate system). Directions indicated by the first, second, and third directions DR1, DR2, and DR3 are relative to each other, and thus, the directions indicated by the first, second, and third directions DR1, DR2, and DR3 may be changed to other directions. In the following descriptions, the expression "when viewed in a plane" may mean a state of being viewed in the third direction DR3.

The electronic apparatus EA may include a display module DD, a bottom chassis HU, a chassis cover SC, an electronic module EM, and a support module SM. A rear surface of the display module DD may be accommodated in the bottom chassis HU, and a front surface of the display module DD may provide the image to a user. The display module DD may include a display unit DP described later. The display module DD may include a circuit board and a driving element to drive the display unit DP.

The support module SM may be coupled to one of the chassis cover SC and the bottom chassis HU to support the display module DD and the bottom chassis HU. In the embodiment described herein, two support modules SM that are spaced apart from each other in the second direction DR2 and disposed at a lower portion of the chassis cover SC are shown, however, they should not be limited thereto or thereby. As another way, the support module SM may be omitted, the electronic apparatus EA may be connected to a wall by an engaging portion engaged with a rear surface of the bottom chassis HU, and a separate supporter may be provided.

The electronic apparatus EA may include a bezel area BZA. The bezel area BZA may surround the active area AA. The bezel area BZA according to the embodiments described herein may be provided by the bottom chassis HU. Referring to FIG. 3, the bottom chassis HU may surround a side surface of the display module DD to support the display module DD, and in this case, a bezel portion BZ in which the bottom chassis HU surrounds the display module DD may be visible to the user as the bezel area BZA. The bottom chassis HU may include an accommodation portion CB and a chassis plate CP. The accommodation portion CB may be provided with an opening CP-H in which the chassis plate CP is disposed, and the chassis plate CP may be accommodated in the opening CP-H. A portion of the display module DD may be accommodated in the accommodation portion CB and may be supported by the accommodation portion CB, and the electronic module EM may be accommodated in the chassis plate CP.

The electronic module EM may include at least one module for a driving of the display module DD or for the user's convenience. For example, the electronic module EM may include a main board, a power supply, a speaker, a memory, an illumination sensor, a driver, and or the like. The electronic module EM may be connected to the display module DD, may be accommodated in the chassis plate CP, and may be covered by the chassis cover SC.

The chassis cover SC may cover the electronic module EM to protect the electronic module EM from external impacts. The chassis cover SC may be coupled to the bottom chassis HU and may provide an exterior of the electronic apparatus ED.

Referring to FIG. 4, the accommodation portion CB of the bottom chassis, which is separated from the chassis plate CP, is shown.

The accommodation portion CB may include the bezel portion BZ and a bottom portion BH. According to the embodiments described herein, the bezel area BZA visible to and thereby perceived by the user may be defined by the shape of the bezel portion BZ. The bezel portion BZ may surround the side surface of the display module DD. The opening CP-H in which the chassis plate CP is disposed may be defined through the accommodation portion CB.

The bezel portion BZ may include an upper portion BZ-U, a lower portion BZ-B, a first side portion BZ-L, and a second side portion BZ-R. Each of the upper portion BZ-U, the lower portion BZ-B, the first side portion BZ-L, and the second side portion BZ-R may surround a corresponding side surface among side surfaces of the display module DD. The upper portion BZ-U, the lower portion BZ-B, the first side portion BZ-L, and the second side portion BZ-R may substantially surround the active area AA of the display module DD and may be visible to and thereby perceived by the user to define the bezel area BZA.

The upper portion BZ-U and the lower portion BZ-B may extend in the second direction DR2 and may be spaced apart from each other in the first direction DR1. The first side portion BZ-L and the second side portion BZ-R may extend in the first direction DR1, may be spaced apart from each other in the second direction DR2, and may be connected to the upper portion BZ-U and the lower portion BZ-B. The upper portion BZ-U and the lower portion BZ-B may have a length greater than a length of the first side portion BZ-L and the second side portion BZ-R.

The bottom portion BH may include an upper portion BH-U, a first side portion BH-L, and a second side portion BH-R. The upper portion BH-U may extend in the second direction DR2 and may be disposed between the first side portion BH-L and the second side portion BH-R. The upper portion BH-U of the bottom portion BH may extend from the upper portion BZ-U of the bezel portion BZ. Accordingly, one side of the upper portion BH-U may be connected to the upper portion BZ-U of the bezel portion BZ, and the other side of the upper portion BH-U, which is opposite to the one side of the upper portion BH-U, may define a portion of the opening CP-H.

The first side portion BH-L and the second side portion BH-R may extend in the first direction DR1, and the first side portion BH-L and the second side portion BH-R may be spaced apart from each other in the second direction DR2 with the upper portion BH-U interposed therebetween.

The first side portion BH-L of the bottom portion BH may extend from the first side portion BZ-L of the bezel portion BZ. Accordingly, one side of the first side portion BH-L may be connected to the first side portion BZ-L of the bezel portion BZ, and the other side of the first side portion BH-L, which is opposite to the one side of the first side portion BH-L, may define a portion of the opening CP-H.

The second side portion BH-R of the bottom portion BH may extend from the second side portion BZ-R of the bezel portion BZ. Accordingly, one side of the second side portion BH-R may be connected to the second side portion BZ-R of the bezel portion BZ, and the other side of the second side portion BH-R, which is opposite to the one side of the second side portion BH-R, may define a portion of the opening CP-H.

The opening CP-H defined through the bottom chassis HU of the present disclosure may be defined by the other side of the upper portion BH-U of the bottom portion BH, the other side of the first side portion BH-L of the bottom portion BH, the other side of the second side portion BH-R of the bottom portion BH, and a portion of the lower portion BZ-B of the bezel portion BZ.

When the accommodation portion CB according to the present disclosure is in an assembled state, a first left coupling line BL-L1, a second left coupling line BL-L2, a first right coupling line BL-R1, and a second right coupling line BL-R2 may be formed. The coupling lines will be described in detail later with reference to FIGS. 18A and 18B.

FIG. 5 shows a relation between the first side portion BZ-L (hereinafter, referred to as the bezel portion) of the bezel portion BZ and the first side portion BH-L (hereinafter, referred to as the bottom portion) of the bottom portion BH, however, the following descriptions may be applied to other areas of the bezel portion BZ and the bottom portion BH.

The bottom portion and the bezel portion described hereinafter are substantially a single unit, however, for the convenience of explanation, the bottom portion and the bezel portion are divided into areas by a dotted line. In addition, the bottom portion and the bezel portion may include the same material as each other and may be formed through the same ejection process.

The bottom portion BH-L may include an outer surface B-E, an inner surface B-I, and a side surface B-S. The outer surface B-E may provide an exterior of the electronic apparatus EA, and the inner surface B-I may be a surface adjacent to the display module DD accommodated thereon. The side surface B-S may define the opening CP-H.

The bezel portion BZ-L may protrude from the inner surface B-I of the bottom portion BH-L along the third direction DR3. Accordingly, the display module DD may be accommodated in a space defined due to a step difference between the bezel portion BZ-L and the bottom portion BH-L, which is caused by a thickness of the bezel portion BZ-L. The side surface DD-S of the display module DD may face the bezel portion BZ-L and may be surrounded by the bezel portion BZ-L. The display module DD may be coupled to the bottom portion BH-L by an adhesive layer ADL. The adhesive layer ADL should not be particularly limited as long as it includes an adhesive material, and the adhesive layer ADL may be provided in a tape form.

The display module DD may be coupled to the inner surface B-I of the bottom portion BH-L by an adhesive or adhesive tape. According to the embodiments described herein, as the bottom portion BH accommodating the display module DD and the bezel portion BZ surrounding the display module DD and defining the bezel area BZA are integrally formed with each other, the aesthetics of the electronic apparatus EA may be improved.

Figure 6:
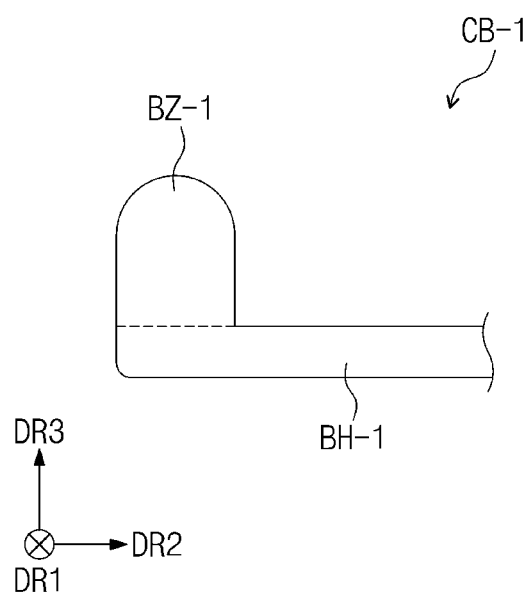
FIG. 6 is a cross-sectional view showing a portion of a bottom chassis according to an embodiment.
Figure 7:
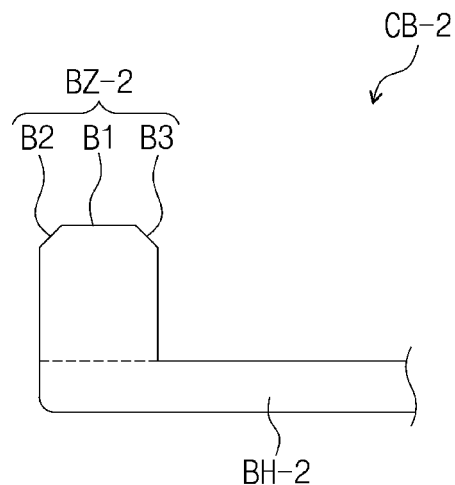
FIG. 7 is a cross-sectional view showing a portion of a bottom chassis according to an embodiment.

FIG. 6 is a cross-sectional view showing a portion of a bottom chassis according to an embodiment, and FIG. 7 is a cross-sectional view showing a portion of a bottom chassis according to an embodiment.

FIGS. 6 and 7 are cross-sectional views schematically showing a left area of the cross-section shown in FIG. 5. In FIGS. 6 and 7, the same reference numerals denote the same elements in FIGS. 1 to 5, and thus, detailed descriptions of the same elements will be omitted for ease in explanation of these figures.

Referring to FIG. 6, an accommodation portion CB-1 according to the present disclosure may include a bottom portion BH-1 and a bezel portion BZ-1.

The bezel portion BZ-1 may protrude from the bottom portion BH-1 along the third direction DR3. In the embodiment described with reference to FIG. 6, the bezel portion BZ-1 may have a predetermined curvature in a cross-section. A portion of the bezel portion BZ-1 having the curvature may be a portion that is viewed by the user.

Referring to FIG. 7, an accommodation portion CB-2 may include a bottom portion BH-2 and a bezel portion BZ-2.

The bezel portion BZ-2 may protrude from the bottom portion BH-2 along the third direction DR3. In the embodiment described with reference to FIG. 7, the bezel portion BZ-2 may include a first bezel portion B1, a second bezel portion B2, and a third bezel portion B3.

The first bezel portion B1 may be substantially parallel to the bottom portion BH-2. The second bezel portion B2 may be inclined from the first bezel portion B1. The third bezel portion B3 may be spaced apart from the second bezel portion B2 with the first bezel portion B1 interposed therebetween and may be inclined from the first bezel portion B1.

The first bezel portion B1, the second bezel portion B2, and the third bezel portion B3 may be visible to and thereby perceived by the user.

Figure 8:
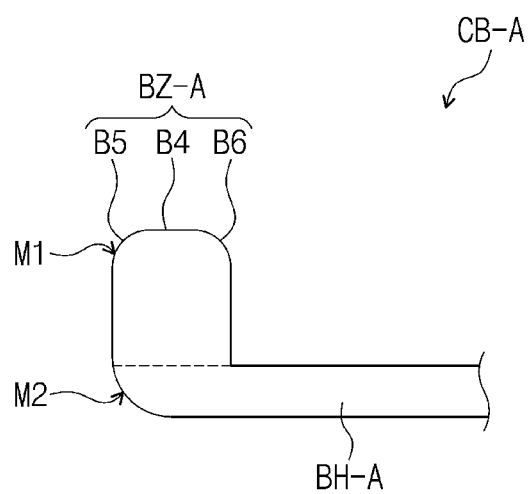
FIG. 8 is a cross-sectional view showing a portion of a bottom chassis according to an embodiment.
Figure 9:
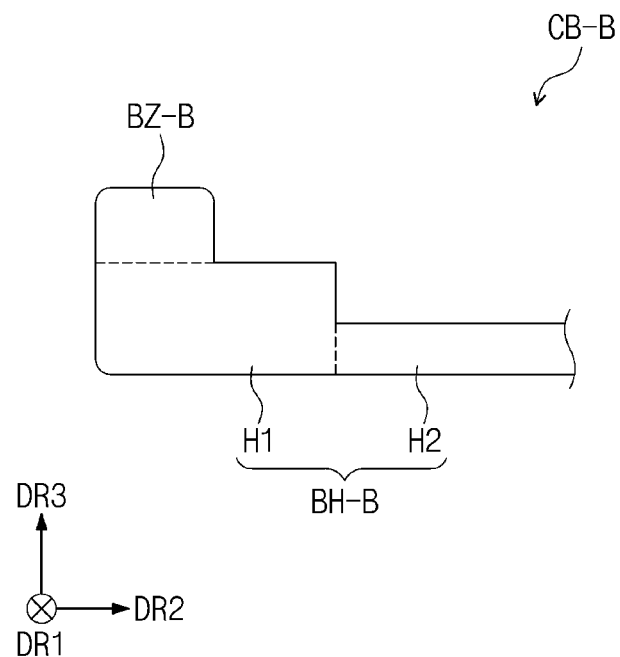
FIG. 9 is a cross-sectional view showing a portion of a bottom chassis according to an embodiment.
Figure 10:
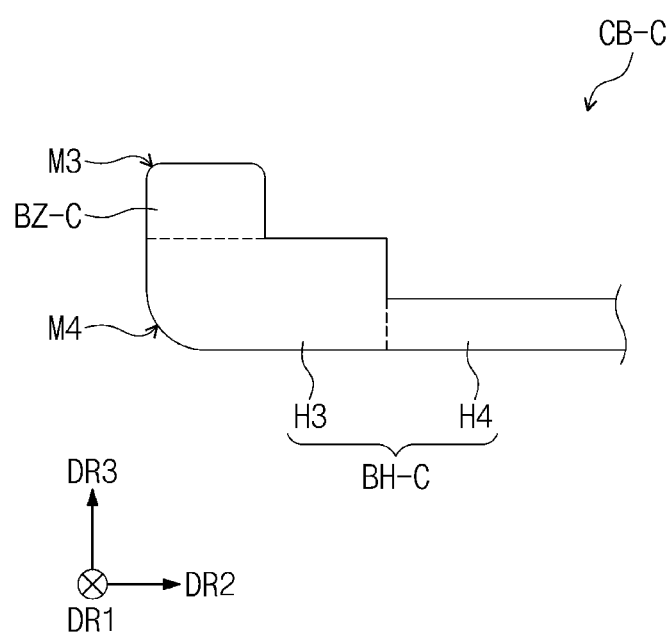
FIG. 10 is a cross-sectional view showing a portion of a bottom chassis according to an embodiment.

FIG. 8 is a cross-sectional view showing a portion of a bottom chassis according to an embodiment. FIG. 9 is a cross-sectional view showing a portion of a bottom chassis according to an embodiment. FIG. 10 is a cross-sectional view showing a portion of a bottom chassis according to an embodiment.

FIGS. 8, 9, and 10 are cross-sectional views schematically showing the left area of the cross-section shown in FIG. 5. In FIGS. 8 to 10, the same reference numerals denote the same elements in FIGS. 1 to 5, and thus, detailed descriptions of the same elements will be omitted for ease in explanation of these figures.

Referring to FIG. 8, an accommodation portion CB-A according to the present disclosure may include a bottom portion BH-A and a bezel portion BZ-A.

The bezel portion BZ-A may protrude from the bottom portion BH-A along the third direction DR3. In the embodiment described with reference to FIG. 8, the bezel portion BZ-A may include a fourth bezel portion B4, a fifth bezel portion B5, and a sixth bezel portion B6.

The fourth bezel portion B4 may be substantially parallel to the bottom portion BH-A. The fifth bezel portion B5 may include a predetermined first curvature M1. The sixth bezel portion B6 may be spaced apart from the fifth bezel portion B5 with the fourth bezel portion B4 interposed therebetween and may have the same curvature as that of the fifth bezel portion B5.

An edge of the bottom portion BH-A, which forms an edge of the bottom chassis HU, may have a second curvature M2. In the embodiment described herein, the second curvature M2 may be greater than the first curvature M1.

Referring to FIG. 9, an accommodation portion CB-B according to the embodiments described with reference to that figure may include a bottom portion BH-B and a bezel portion BZ-B.

The bezel portion BZ-B may protrude from the bottom portion BH-B along the third direction DR3. In the embodiment described with reference to FIG. 9, the bottom portion BH-B may include a first bottom portion H1 and a second bottom portion H2.

The second bottom portion H2 may extend from the first bottom portion H1 to an opening CP-H. The bezel portion BZ-B may protrude from the first bottom portion H1. An end of the second bottom portion H2 may define the opening CP-H.

In the embodiment described herein, a thickness in the third direction DR3 of the first bottom portion H1 may be greater than a thickness in the third direction DR3 of the second bottom portion H2. The bezel portion BZ-B, the first bottom portion H1, and the second bottom portion H2 are substantially a single unit, however, for the convenience of explanation, the bezel portion BZ-B, the first bottom portion H1, and the second bottom portion H2 are divided into areas by a dotted line.

When the display module DD is accommodated in the accommodation portion CB-B, a step difference may be formed between the display module DD and components disposed at a rear surface of the display module DD. According to the embodiment described herein, as the bottom portions H1 and H2 having different thicknesses from each other are provided, the display module DD may be stably accommodated in the accommodation portion CB-B even though the step difference is formed between the components disposed at the rear surface of the display module DD and the display module DD.

Referring to FIG. 10, an accommodation portion CB-C according to the embodiment described with reference to that figure may include a bottom portion BH-C and a bezel portion BZ-C.

The bezel portion BZ-C may protrude from the bottom portion BH-C along the third direction DR3. In the embodiment described with reference to FIG. 10, the bottom portion BH-C may include a first bottom portion H3 and a second bottom portion H4.

The fourth bottom portion H4 may extend from the third bottom portion H3 toward an opening CP-H. The bezel portion BZ-C may protrude from the third bottom portion H3. An end of the fourth bottom portion H4 may define the opening CP-H.

A thickness in the third direction DR3 of the third bottom portion H3 may be greater than a thickness in the third direction DR3 of the fourth bottom portion H4.

In the embodiment described with reference to FIG. 10, an edge of the bezel portion BZ-C may have a third curvature M3, and an edge of the third bottom portion H3 may have a fourth curvature M4. The fourth curvature M4 may be greater than the third curvature M3.

Figure 13:
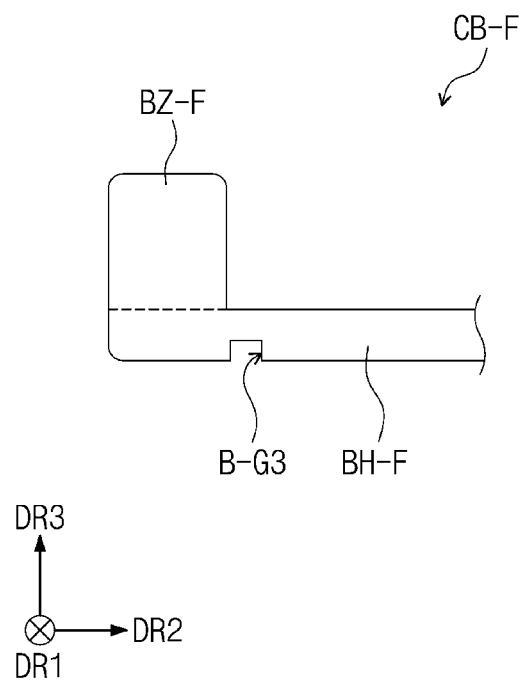
FIG. 13 is a cross-sectional view showing a portion of a bottom chassis according to an embodiment.

FIG. 11 is a cross-sectional view showing a portion of a bottom chassis according to an embodiment. FIG. 12 is a cross-sectional view showing a portion of a bottom chassis according to an embodiment. FIG. 13 is a cross-sectional view showing a portion of a bottom chassis according to an embodiment.

FIGS. 11 to 13 are cross-sectional views schematically showing the left area of the cross-section shown in FIG. 5. In FIGS. 11 to 13, the same reference numerals denote the same elements in FIGS. 1 to 5, and thus, detailed descriptions of the same elements will be omitted for ease in explanation of these figures.

Referring to FIG. 11, an accommodation portion CB-D according to the present disclosure may include a bottom portion BH-D and a bezel portion BZ-D. The bezel portion BZ-D may protrude from the bottom portion BH-D along the third direction DR3.

The bottom portion BH-D may be provided with a first groove B-G1 defined therein. The first groove B-G1 may be formed by removing a portion of the bottom portion BH-D along the third direction DR3, e.g., a thickness direction of the bottom portion BH-D. The first groove B-G1 may be formed in the bottom portion BH-D in accordance with the shape of the bezel portion BZ-D extending in one direction.

In the embodiment described herein, the first groove B-G1 may have a shape similar to a triangular shape. For example, inner surfaces of the bottom portion BH-D, which form the first groove B-G1, may form a V-shape.

Referring to FIG. 12, an accommodation portion CB-E according to the present disclosure may include a bottom portion BH-E and a bezel portion BZ-E. The bezel portion BZ-E may protrude from the bottom portion BH-E along the third direction DR3.

The bottom portion BH-E may be provided with a second groove B-G2 defined therein. The second groove B-G2 may be formed by removing a portion of the bottom portion BH-E along the third direction DR3, e.g., a thickness direction of the bottom portion BH-E. The second groove B-G2 may be formed in the bottom portion BH-E in accordance with the shape of the bezel portion BZ-E extending in one direction.

In the embodiment described with reference to FIG. 12, the second groove B-G2 may have a curved shape. For example, inner surfaces of the bottom portion BH-E, which form the second groove B-G2, may form a U-shape.

Referring to FIG. 13, an accommodation portion CB-F according to the present disclosure may include a bottom portion BH-F and a bezel portion BZ-F. The bezel portion BZ-F may protrude from the bottom portion BH-F along the third direction DR3.

The bottom portion BH-F may be provided with a third groove B-G3 defined therein. The third groove B-G3 may be formed by removing a portion of the bottom portion BH-F along the third direction DR3, i.e., a thickness direction of the bottom portion BH-F. The third groove B-G3 may be formed in the bottom portion BH-F in accordance with the shape of the bezel portion BZ-F extending in one direction.

In the embodiment described with reference to FIG. 12, the third groove B-G3 may have an angled shape. For example, inner surfaces of the bottom portion BH-F, which form the third groove B-G3, may have a U bracket shape.

According to the embodiments described with reference to FIGS. 11 to 13, as the groove is defined in the bottom portion by removing the portion of the bottom portion, a boundary between the bottom portion and the bezel portion may be indirectly perceived by the user. Accordingly, the aesthetics of the electronic apparatus EA may be improved.

Figure 14:
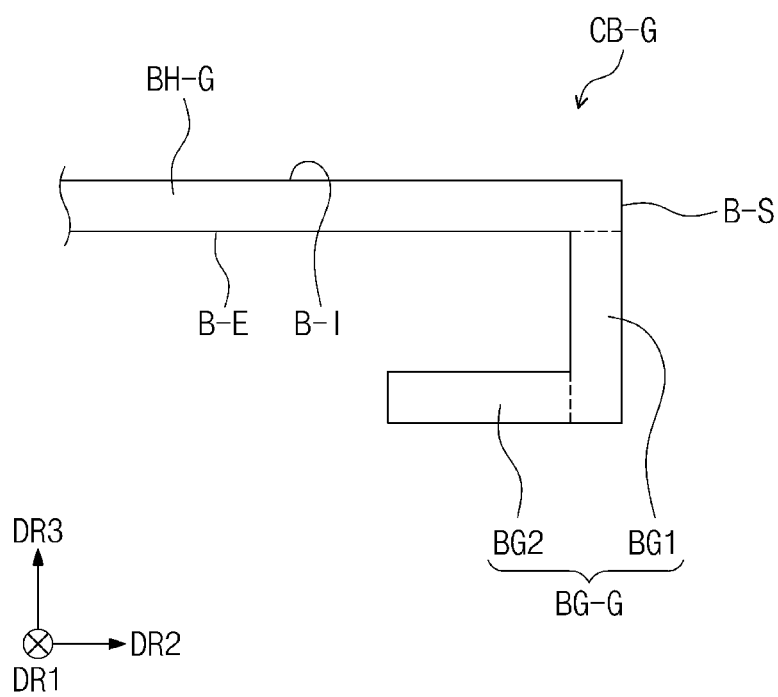
FIG. 14 is a cross-sectional view showing a portion of a bottom chassis according to an embodiment.
Figure 15:
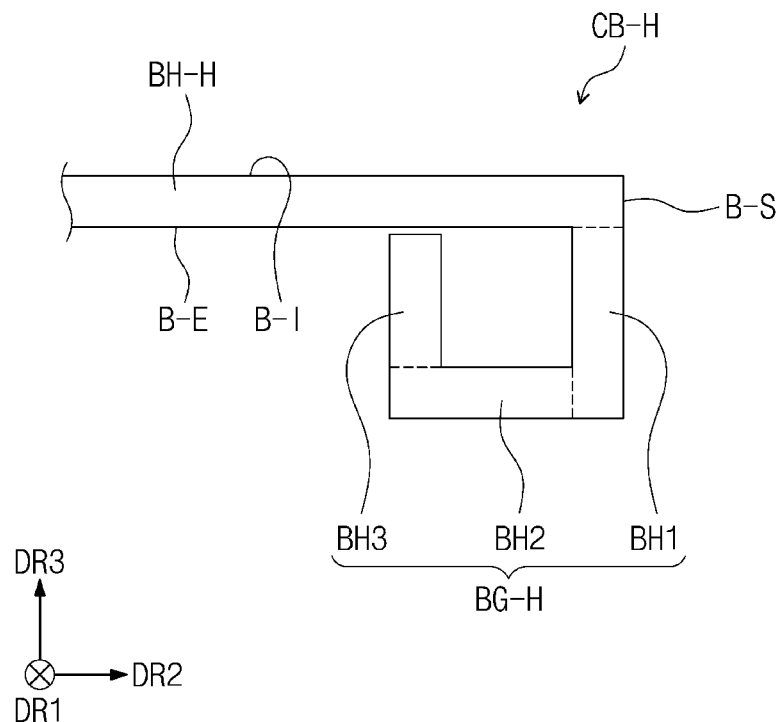
FIG. 15 is a cross-sectional view showing a portion of a bottom chassis according to an embodiment
Figure 16:
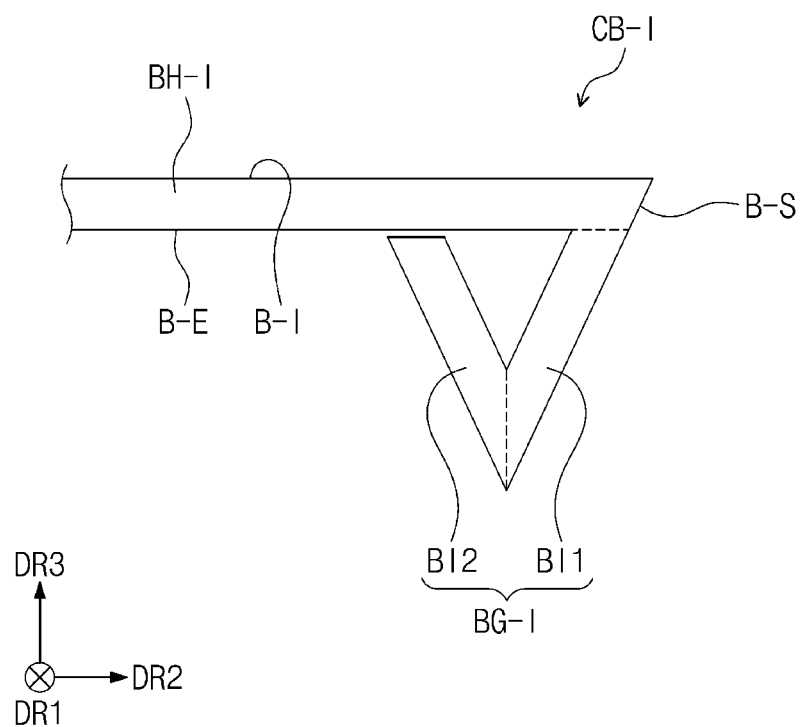
FIG. 16 is a cross-sectional view showing a portion of a bottom chassis according to an embodiment.
Figure 17:
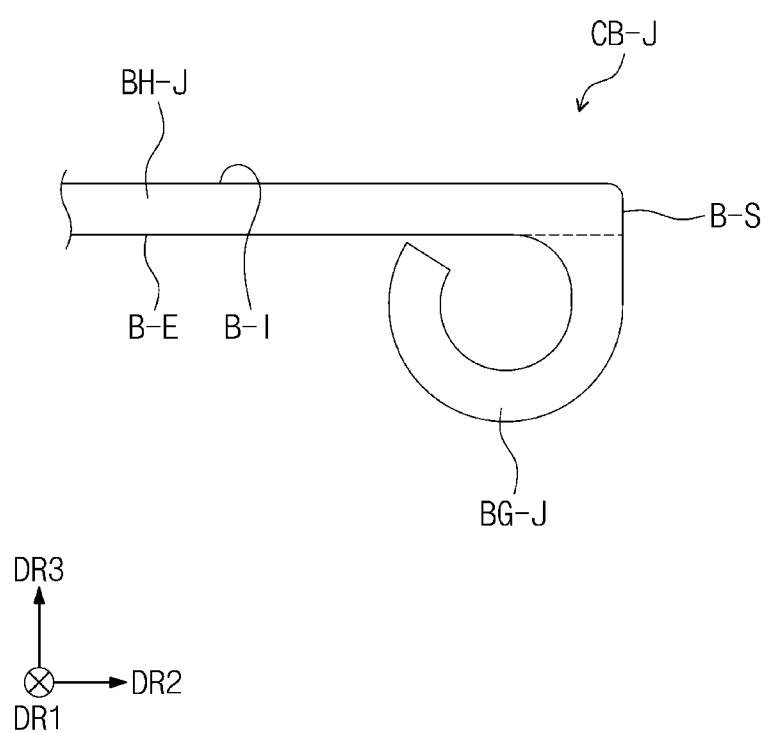
FIG. 17 is a cross-sectional view showing a portion of a bottom chassis according to an embodiment.

FIG. 14 is a cross-sectional view showing a portion of a bottom chassis according to an embodiment. FIG. 15 is a cross-sectional view showing a portion of a bottom chassis according to an embodiment. FIG. 16 is a cross-sectional view showing a portion of a bottom chassis according to an embodiment. FIG. 17 is a cross-sectional view showing a portion of a bottom chassis according to an embodiment.

FIGS. 14 to 17 are cross-sectional views schematically showing a right area of the cross-section shown in FIG. 5. In FIGS. 14 to 17, the same reference numerals denote the same elements in FIGS. 1 to 5, and thus, detailed descriptions of the same elements will be omitted for ease in explanation of these figures.

In FIGS. 14 to 17, a bezel portion included in an accommodation portion is not shown, and descriptions on the bezel portion and the bottom portion with reference to FIGS. 5 to 13 may be applied to the accommodation portions shown in FIGS. 14 to 17.

Referring to FIG. 14, the accommodation portion CB-G according to the embodiment described with reference to that figure may include a bezel portion (not shown), a bottom portion BH-G, and a reinforcing portion BG-G. The bottom portion BH-G may include an inner surface B-I, an outer surface B-E, and a side surface B-S.

The reinforcing portion BG-G may be spaced apart from the bezel portion (not shown) with the bottom portion BH-G interposed therebetween and may be disposed adjacent to an opening CP-H.

The reinforcing portion BG-G may include a first reinforcing portion BG1 and a second reinforcing portion BG2. The first reinforcing portion BG1 may protrude from the outer surface B-E of the bottom portion BH-G and may be substantially perpendicular to the bottom portion BH-G. The second reinforcing portion BG2 may extend from the first reinforcing portion BG1. The second reinforcing portion BG2 may protrude from the first reinforcing portion BG1 toward the bezel portion (not shown) and may be substantially parallel to the bottom portion BH-G.

Referring to FIG. 15, the accommodation portion CB-H according to the embodiment described with reference to that figure may include a bezel portion (not shown), a bottom portion BH-H, and a reinforcing portion BG-H. The bottom portion BH-H may include an inner surface B-I, an outer surface B-E, and a side surface B-S.

The reinforcing portion BG-H may be spaced apart from the bezel portion (not shown) with the bottom portion BH-H interposed therebetween and may be disposed adjacent to an opening CP-H.

The reinforcing portion BG-H may include a first reinforcing portion BH1, a second reinforcing portion BH2, and a third reinforcing portion BH3. The first reinforcing portion BH1 may protrude from the outer surface B-E of the bottom portion BH-H and may be substantially perpendicular to the bottom portion BH-H. The second reinforcing portion BH2 may extend from the first reinforcing portion BH1. The second reinforcing portion BH2 may protrude from the first reinforcing portion BH1 toward the bezel portion (not shown) and may be substantially parallel to the bottom portion BH-H. The third reinforcing portion BH3 may protrude from the second reinforcing portion BH2. The third reinforcing portion BH3 may protrude toward the outer surface B-E of the bottom portion BH-H, may be substantially perpendicular to the bottom portion BH-H, and may be substantially parallel to the first reinforcing portion BH1.

Referring to FIG. 16, the accommodation portion CB-I according to the embodiment described with reference to that figure may include a bezel portion (not shown), a bottom portion BH-I, and a reinforcing portion BG-I. The bottom portion BH-I may include an inner surface B-I, an outer surface B-E, and a side surface B-S.

The reinforcing portion BG-I may be spaced apart from the bezel portion (not shown) with the bottom portion BH-I interposed therebetween and may be disposed adjacent to an opening CP-H.

The reinforcing portion BG-I may include a first reinforcing portion BI1 and a second reinforcing portion BI2. The first reinforcing portion BI1 may protrude from the outer surface B-E of the bottom portion BH-I and may be inclined with respect to the bottom portion BH-I. The second reinforcing portion BI2 may extend from the first reinforcing portion BH1. An angle between the outer surface B-E of the bottom portion BH-I and the first reinforcing portion BH1 may be an acute angle.

The second reinforcing portion BI2 may extend from the first reinforcing portion BI1. The second reinforcing portion BI2 may protrude toward the outer surface B-E of the bottom portion BH-I. An angle between the second reinforcing portion BI2 and the first reinforcing portion BH1 may be an acute angle.

In the embodiment described with reference to FIG. 16, the side surface B-S of the bottom portion BH-I is inclined along the direction in which the first reinforcing portion BI1 extends, however, it should not be limited thereto or thereby. The side surface B-S may be substantially perpendicular to the outer surface B-E and the inner surface B-I.

Referring to FIG. 17, the accommodation portion CB-J according to the embodiment described with reference to this figure may include a bezel portion (not shown), a bottom portion BH-J, and a reinforcing portion BG-J. The bottom portion BH-J may include an inner surface B-I, an outer surface B-E, and a side surface B-S.

The reinforcing portion BG-J may be spaced apart from the bezel portion (not shown) with the bottom portion BH-J interposed therebetween and may be disposed adjacent to an opening CP-H. The reinforcing portion BG-J may protrude from the outer surface B-E of the bottom portion BH-J. In the embodiment described herein, the reinforcing portion BG-J may be rolled toward the outer surface B-E of the bottom portion BH-J.

According to the embodiments described with reference to FIGS. 14 to 17, the accommodation portion may include the reinforcing portion disposed adjacent to the opening CP-H and protruding toward the outer surface of the bottom portion, and thus, the strength of the bottom chassis included in the electronic apparatus may be improved.

Figure 18A:
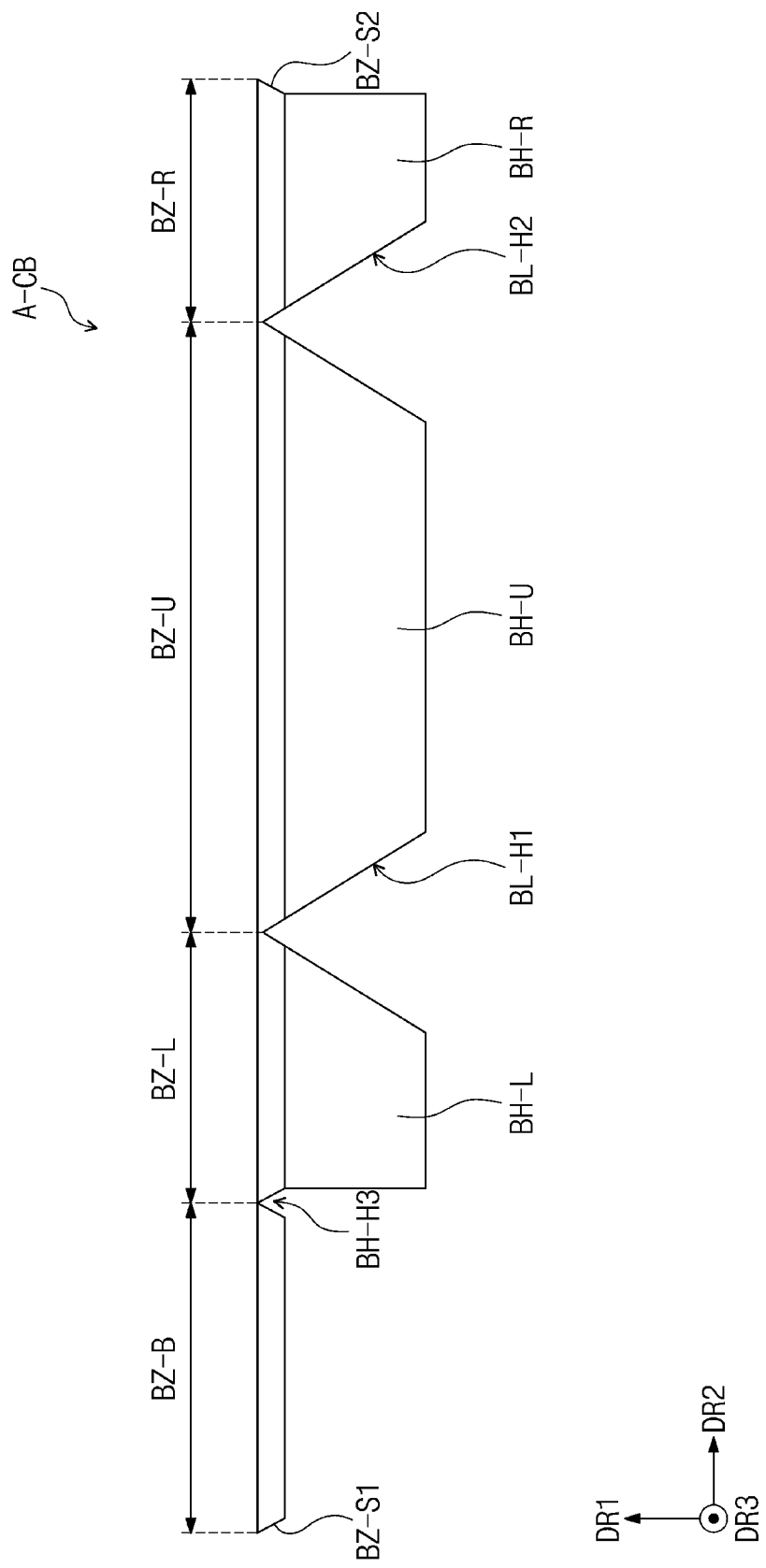
FIG. 18A is a plan view showing a bottom chassis in an unfolded state according to an embodiment.
Figure 18B:
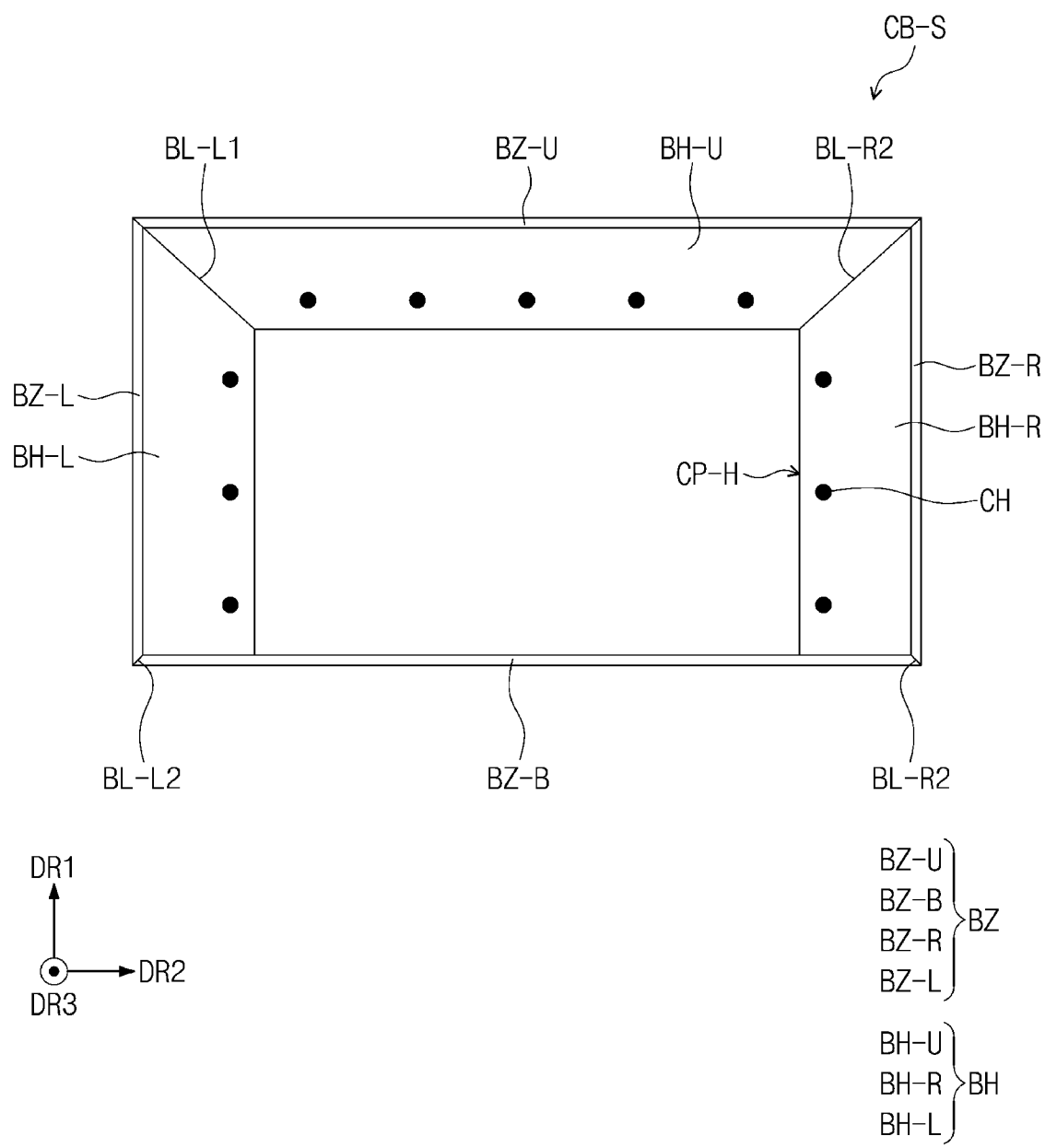
FIG. 18B is a plan view showing a bottom chassis in an assembled state according to an embodiment.

FIG. 18A is a plan view showing a bottom chassis in an unfolded state according to an embodiment, and FIG. 18B is a plan view showing the bottom chassis in an assembled state according to an embodiment. In FIGS. 18A and 18B, the same reference numerals denote the same elements in FIGS. 1 to 5, and thus, detailed descriptions of the same elements will be omitted for ease in explanation of these figures.

FIG. 18A shows an initial accommodation portion A-CB before being assembled to an accommodation portion CB-S of FIG. 18B, and FIG. 18B shows the accommodation portion CB-S after the initial accommodation portion A-CB of FIG. 18A is assembled. The initial accommodation portion A-CB may include an initial bezel portion and an initial bottom portion.

The above-described accommodation portions according to the embodiments described herein may be formed through the same processes as those of the accommodation portion CB-S described with reference to FIGS. 18A and 18B.

The initial bezel portion of the initial accommodation portion A-CB may include a lower portion BZ-B, a first side portion BZ-L, an upper portion BZ-U, and a second side portion BZ-R, which are sequentially arranged in the second direction DR2.

The other side of the lower portion BZ-B, which is opposite to one side of the lower portion BZ-B extending from the first side portion BZ-L, may include a first slope portion BZ-S1. The other side of the second side portion BZ-R, which is opposite to one side of the second side portion BZ-R extending from the upper portion BH-U, may include a second slope portion BZ-S2.

The initial bottom portion of the initial accommodation portion A-CB may include a first side portion BH-L, an upper portion BH-U, and a second side portion BH-R, which are sequentially arranged in the second direction DR2. The first side portion BH-L may extend from the first side portion BZ-L of the initial accommodation portion A-CB along the direction DR1, the upper portion BH-U may extend from the upper portion BZ-U of the initial accommodation portion A-CB along the first direction DR1, and the second side portion BH-R may extend from the second side portion BZ-R of the initial accommodation portion A-CB along the first direction DR1.

The initial accommodation portion A-CB may include a first cutting portion BL-H1, a second cutting portion BL-H2, and a third cutting portion BH-H3. Each cutting portion may be formed by removing a corresponding initial bottom portion and a corresponding initial bezel portion.

An inner side of the upper portion BZ-U and an inner side of the first side portion BZ-L of the initial bezel portion and an inner side of the upper portion BH-U and an inner side of the first side portion BH-L of the initial bottom portion, which form the first cutting portion BL-H1, may be coupled to each other to form the first left coupling line BL-L1 of the accommodation portion CB-S. An inner side of the upper portion BZ-U and an inner side of the second side portion BZ-R of the initial bezel portion and an inner side of the upper portion BH-U and an inner side of the second side portion BH-R of the initial bottom portion, which form the second cutting portion BL-H2, may be coupled to each other to form the first right coupling line BL-R1 of the accommodation portion CB-S.

An inner side of the lower portion BZ-B and an inner side of the first side portion BZ-L of the initial bezel portion, which form the third cutting portion BL-H3, may be coupled to each other to form the second left coupling line BL-L2 of the accommodation portion CB-S.

The first slope portion BZ-S1 of the lower portion BZ-B and the second slope portion BZ-S2 of the second side portion BZ-R may be coupled to each other to form the second right coupling line BL-R2.

In the embodiment described with reference to FIG. 18A and FIG. 18B, the accommodation portion CB-S may further include an engaging portion CH. The chassis cover SC (refer to FIG. 2) may be coupled to the accommodation portion CB-S by the engaging portion CH.

The engaging portion CH may have one of a bolt and a screw, however, it should not be limited thereto or thereby. The engaging portion CH should not be particularly limited as long as the engaging portion CH has a shape to which the chassis cover SC (refer to FIG. 2) is engaged.

According to the embodiments described herein, the cutting portions are formed in a single plate, and the accommodation portion CB-S is formed by bending the plate, and thus, the accommodation portion CB-S may have improved aesthetics and strength. In addition, since a separate process required to form the bezel portion is omitted when the bezel portion is manufactured, a manufacturing time and cost may be reduced.

Figure 19:
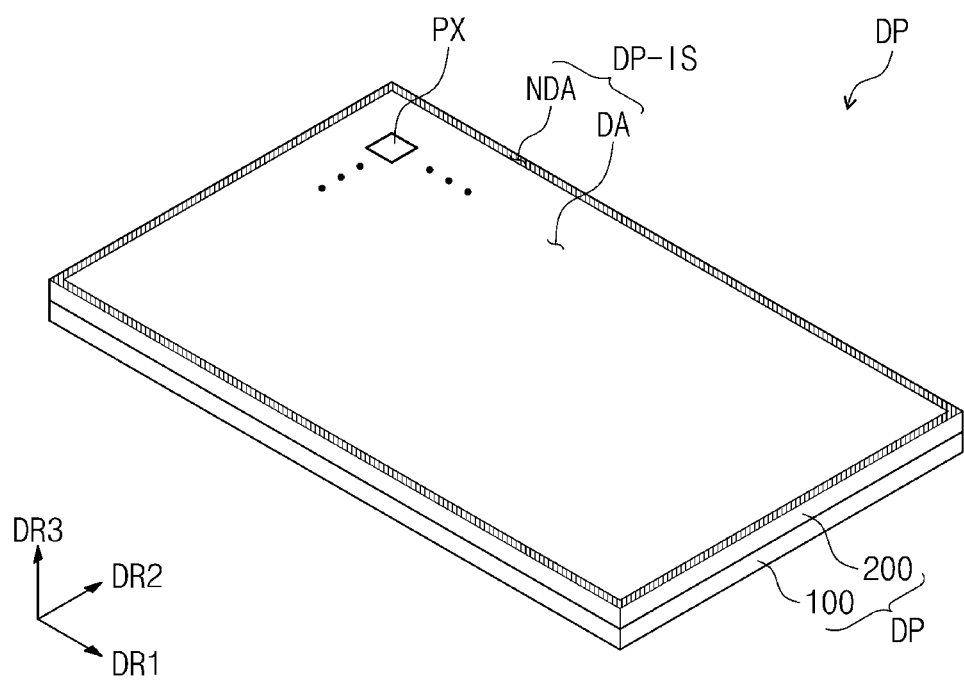
FIG. 19 is a perspective view showing a display unit according to an embodiment.
Figure 20A:
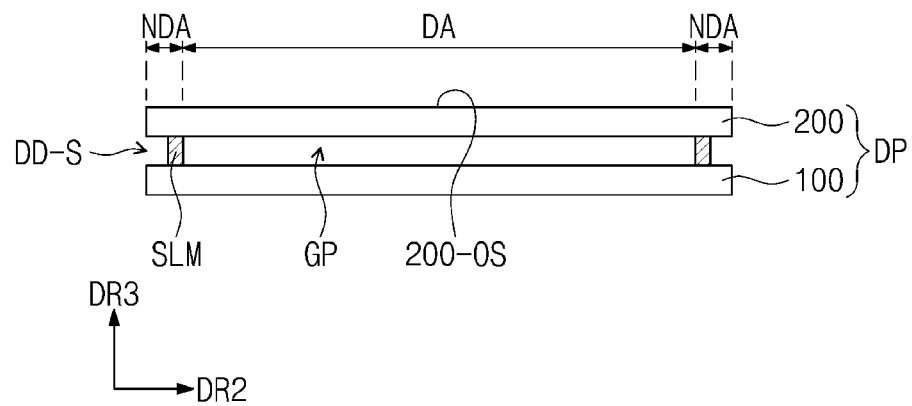
FIG. 20A is a cross-sectional view showing a display unit according to an embodiment.
Figure 20B:
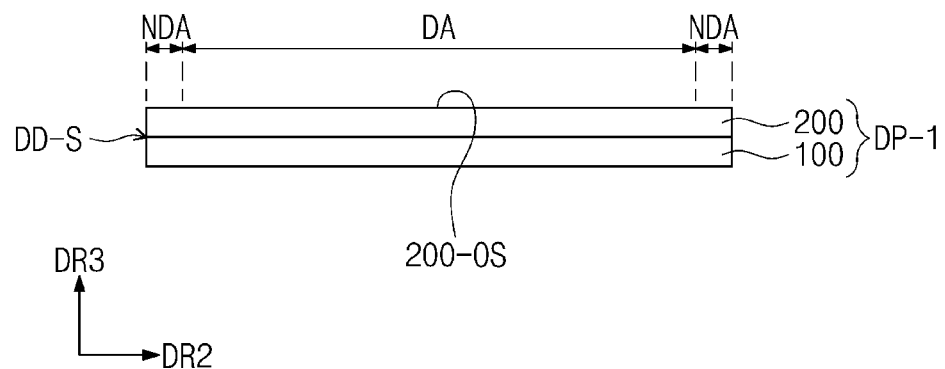
FIG. 20B is a cross-sectional view showing a display unit according to an embodiment.
Figure 21:
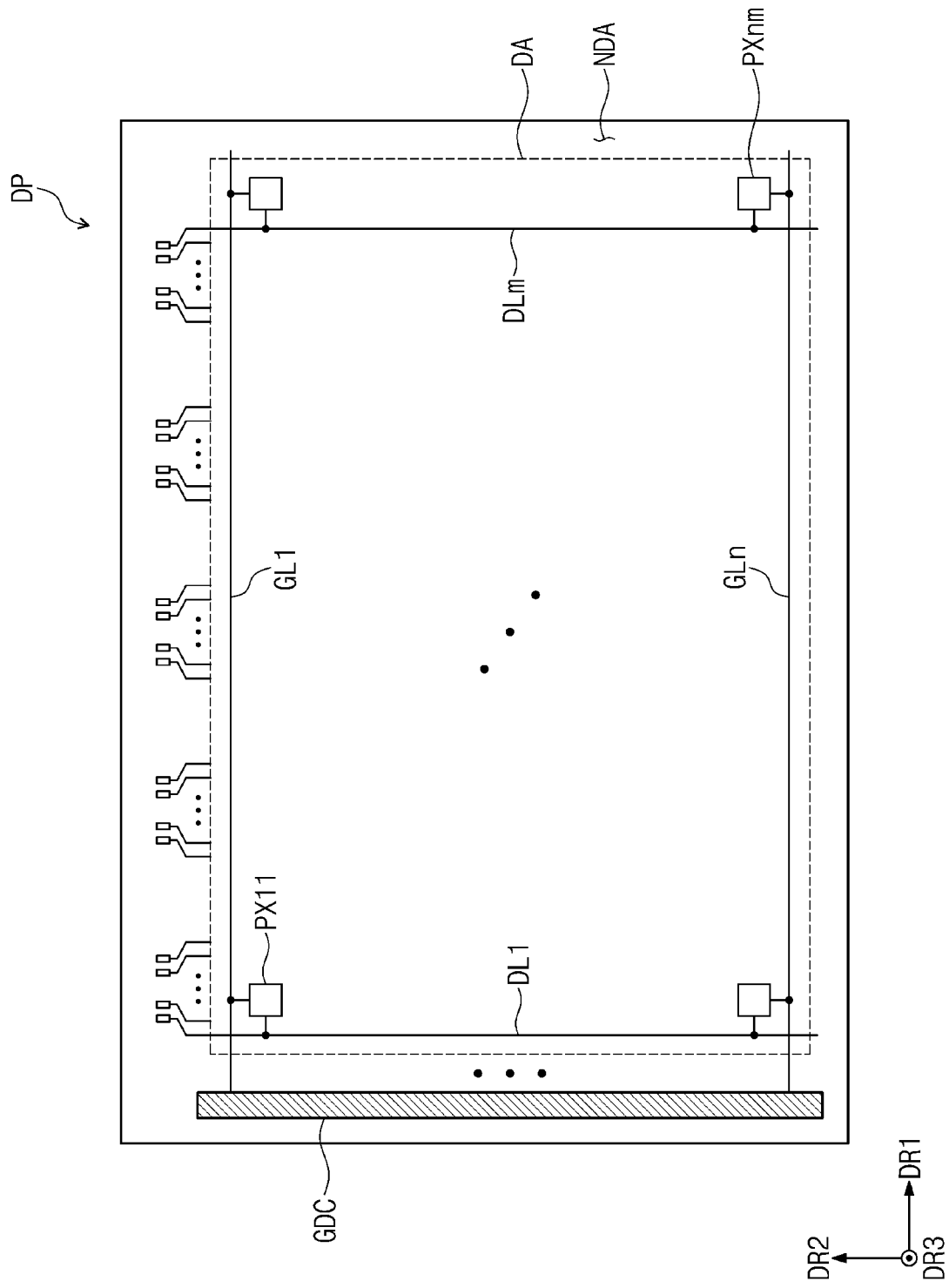
FIG. 21 is a plan view showing a display unit according to an embodiment.

FIG. 19 is a perspective view showing a display unit DP according to an embodiment. FIG. 20A is a cross-sectional view showing a display unit DP according to an embodiment. FIG. 20B is a cross-sectional view showing a display unit DP-1 according to an embodiment. FIG. 21 is a plan view showing a display unit DP according to an embodiment.

Referring to FIGS. 19 and 20A, the display unit DP may display an image through a display surface DP-IS. The display surface DP-IS of the display unit DP may be defined as an outer surface 200-OS of a second display substrate 200.

The display unit DP may include a first display substrate 100 and the second display substrate 200 facing and spaced apart from the first display substrate 100. A predetermined cell gap GP may be defined between the first display substrate 100 and the second display substrate 200.

The cell gap GP may be maintained by a sealant SLM that combines the first display substrate 100 and the second display substrate 200. The sealant SLM may be disposed along an edge of the first display substrate 100 and the second display substrate 200 and may overlap a non-display area NDA. As described above, the bezel portion BZ (refer to FIG. 4) may surround a side surface DD-S of the display unit DP.

A grayscale display layer may be disposed between the first display substrate 100 and the second display substrate 200 to generate the image. The grayscale display layer may include one of a liquid crystal layer, an organic light emitting layer, an inorganic light emitting layer, and an electrophoretic layer depending on the type of the display unit DP.

For example, the first display substrate 100 of the display unit DP may include a circuit element layer including a transistor, a display element layer including a light emitting element connected to the transistor and disposed on the circuit element layer, and an upper insulating layer covering the display element layer to block moisture and oxygen entering the display element layer. The upper insulating layer may be a thin film encapsulation layer including a plurality of inorganic layers and a plurality of organic layers, which are stacked one on another.

The second display substrate 200 of the display unit DP may include color control layers that control a wavelength of a light provided from the display element layer and include different quantum dots from each other.

The display surface DP-IS may be substantially parallel to a plane defined by the first direction DR1 and the second direction DR2. The display surface DP-IS may include a display area DA and the non-display area NDA.

Pixels PX may be arranged in the display area DA and may not be arranged in the non-display area NDA. The non-display area NDA may be defined along an edge of the display surface DP-IS. The display area DA may be surrounded by the non-display area NDA. According to an embodiment, the non-display area NDA may be omitted or may be disposed only at one side of the display area DA.

In the embodiments described herein, the display unit DP including a flat display surface DP-IS is shown, however, it should not be limited thereto or thereby. The display unit DP may include a curved display surface or a three-dimensional display surface. The three-dimensional display surface may include a plurality of display areas facing different directions from each other.

Although not shown in figures, the display unit DP may further include a protective film that covers the display surface DP-IS. The protective film may be disposed at an outermost position, and thus, the protective film may protect the display unit DP from external impacts and may prevent moisture and oxygen from entering the display unit DP.

Referring to FIG. 20B, different from the display unit DP shown in FIG. 20A in which the first display substrate 100 is coupled to the second display substrate 200 by the sealant SLM with the cell gap GP defined therebetween, a second display substrate 200 of the display unit DP-1 may be disposed directly on a first display substrate 100 of the display unit DP-1. Accordingly, color control layers of the second display substrate 200 may be disposed directly on an upper insulating layer of the first display substrate 100 through successive processes instead of being formed on a separate substrate and then disposed on the first display substrate 100.

FIG. 21 shows an arrangement relation between signal lines GL1 to GLn and DL1 to DLm and the pixels PX11 to PXnm when viewed in a plane. The signal lines GL1 to GLn and DL1 to DLm may include a plurality of gate lines GL1 to GLn and a plurality of data lines DL1 to DLm.

Each of the pixels PX11 to PXnm may be connected to a corresponding gate line among the gate lines GL1 to GLn and a corresponding data line among the data lines DL1 to DLm. Each of the pixels PX11 to PXnm may include a pixel driving circuit and a display element. Depending on configurations of the pixel driving circuit of the pixels PX11 to PXnm, various types of signal lines may be provided in the display unit DP.

In FIG. 21, the pixels PX11 to PXnm are arranged in a matrix form, however, they should not be limited thereto or thereby. For example, the pixels PX11 to PXnm may be arranged in a pentile shape, or the pixels PX11 to PXnm may be arranged in a diamond shape. A gate driving circuit GDC may be integrated in the display unit DP through an oxide silicon gate driver circuit (OSG) or amorphous silicon gate driver circuit (ASG) process.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An electronic apparatus comprising:
a display module comprising a front surface and a rear surface and configured to display an image via the front surface; and
a chassis accommodating the display module, the chassis comprising:

a bottom portion provided with an opening defined therethrough and comprising an inner surface adjacent to the display module and an outer surface facing the inner surface;

a bezel portion protruding from the inner surface of the bottom portion; and a chassis plate disposed in the opening.

2. The electronic apparatus of claim 1, wherein the bezel portion surrounds a side surface of the display module.

3. The electronic apparatus of claim 1, wherein the bezel portion has a predetermined curvature.

4. The electronic apparatus of claim 1, wherein an edge of the bezel portion and a edge of the bottom portion adjacent to the bezel portion have a predetermined curvature.

5. The electronic apparatus of claim 4, wherein the curvature of the edge of the bottom portion is greater than the curvature of the edge of the bezel portion.

6. The electronic apparatus of claim 1, wherein the bezel portion comprises:

a first bezel portion substantially parallel to the bottom portion;

a second bezel portion inclined from the first bezel portion; and a third bezel portion spaced apart from the second bezel portion with the first bezel portion interposed therebetween and inclined from the first bezel portion.

7. The electronic apparatus of claim 1, wherein the bottom portion comprises:

a first bottom portion on which the bezel portion is disposed; and a second bottom portion extending from the first bottom portion and provided with the opening defined therein, and the first bottom portion having a thickness greater than a thickness of the second bottom portion.

8. The electronic apparatus of claim 1, wherein the bottom portion is provided with a groove defined by removing a portion of the bottom portion along a thickness direction of the bottom portion.

9. The electronic apparatus of claim 8, wherein the groove has a V shape, a U shape, or a U bracket shape when viewed in cross-section.

10. The electronic apparatus of claim 1, wherein the bottom portion further comprises a reinforcing portion adjacent to a side surface of the bottom portion, which defines the opening, and which protrudes from the outer surface of the bottom portion.

11. The electronic apparatus of claim 10, wherein the reinforcing portion comprises:

a first reinforcing portion substantially perpendicular to the bottom portion; and a second reinforcing portion extending from the first reinforcing portion and substantially parallel to the bottom portion.

12. The electronic apparatus of claim 11, wherein the reinforcing portion further comprises a third reinforcing portion protruding from the second reinforcing portion toward the bottom portion.

13. The electronic apparatus of claim 10, wherein the reinforcing portion comprises:

a first reinforcing portion inclined with respect to the bottom portion; and a second reinforcing portion inclined from the first reinforcing portion to the bottom portion.

14. The electronic apparatus of claim 10, wherein the reinforcing portion has a predetermined curvature.

15. The electronic apparatus of claim 1, wherein the bottom portion comprises an engaging portion disposed adjacent to the opening and coupled to the chassis plate.

16. The electronic apparatus of claim 1, wherein the bezel portion comprises:

an upper portion and a lower portion, which are spaced apart from each other in a first direction and which extend in a second direction crossing the first direction; and a first side portion and a second side portion, which are spaced apart from each other in the second direction, extend in the first direction, and which are connected to the upper portion and the lower portion, and wherein the bottom portion comprises:

a top portion connected to the upper portion of the bezel portion;

a first side portion connected to the first side portion of the bezel portion; and a second side portion connected to the second side portion of the bezel portion.

17. The electronic apparatus of claim 16, wherein the opening is defined by the top portion, the first side portion, and the second side portion of the bottom portion and the lower portion of the bezel portion.

18. The electronic apparatus of claim 1, further comprising an electronic module electrically connected to the display module and comprising at least one of a power supply unit, a speaker, a memory, an illumination sensor, and a driver, wherein the electronic module is disposed on the chassis plate.

19. The electronic apparatus of claim 1, wherein the display module comprises a display unit comprising:

a first display substrate comprising a circuit element layer comprising a transistor, a display element layer comprising a light emitting element connected to the transistor, and an upper insulating layer covering the display element layer; and a second display substrate spaced apart from the first display substrate with a predetermined gap defined therebetween and comprising a color control layer comprising a quantum dot.

20. The electronic apparatus of claim 1, wherein the display module comprises:

a circuit element layer comprising a transistor;

a display element layer comprising a light emitting element connected to the transistor;

an upper insulating layer covering the display element layer; and a color control layer making contact with the upper insulating layer, wherein the color control layer comprises a quantum dot.

* * * * *